United States Patent
Omarjee et al.

(10) Patent No.: US 8,367,531 B1
(45) Date of Patent: Feb. 5, 2013

(54) ALUMINUM IMPLANT USING NEW COMPOUNDS

(75) Inventors: Vincent M. Omarjee, Albany, NY (US); Christian Dussarrat, Wilmington, DE (US); Jean-Marc Girard, Tokyo (JP); Nicolas Blasco, Grenoble (FR)

(73) Assignees: L'Air Liquide Societe Anonyme pour l'Etude et l'Exploitation des Procedes Georges Claude, Paris (FR); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 13/041,154

(22) Filed: Mar. 4, 2011

Related U.S. Application Data

(60) Provisional application No. 61/316,642, filed on Mar. 23, 2010.

(51) Int. Cl.
*H01L 21/425* (2006.01)
(52) U.S. Cl. ........................ 438/514; 438/513
(58) Field of Classification Search .................. 438/510, 438/513, 514, 515
See application file for complete search history.

(56) References Cited

U.S. PATENT DOCUMENTS

| | | | |
|---|---|---|---|
| 5,497,005 A | 3/1996 | Medulla et al. | |
| 7,816,706 B2 * | 10/2010 | Rahimo et al. | 257/147 |
| 8,114,693 B1 * | 2/2012 | Quick et al. | 438/45 |
| 2006/0019039 A1 * | 1/2006 | Hanawa et al. | 427/523 |
| 2007/0178676 A1 * | 8/2007 | Oda | 438/502 |
| 2008/0241575 A1 | 10/2008 | Lavoie et al. | |
| 2009/0118823 A1 * | 5/2009 | Atanasoska et al. | 623/1.49 |
| 2009/0190908 A1 | 7/2009 | Shibagaki | |

OTHER PUBLICATIONS

Amemiya, Kensuke et al., "High energy aluminum ion implantation using a variable energy radio frequency quadrupole implanter," J. Vac. Sci. Technol., A 16(2), Mar./Apr. 1998, pp. 472-476.

Glass, J.A. et al., "Chemical vapor deposition precursor chemistry. 5. The photolytic laser deposition of aluminum thin films by chemical vapor deposition," J. Phys. Chem. Solids, 1996 (57) 5, p. 563-570.

Felch, S.B. et al., "Plasma doping for the fabrication of ultra-shallow junctions," Surface and Coatings Technology 156 (2002) pp. 229-236.

Jain, I.P. et al., "Ion beam induced surface and interface engineering," Surface Science Reports 66 (2011) pp. 77-172.

* cited by examiner

*Primary Examiner* — Fernando L Toledo
*Assistant Examiner* — Bryan Junge
(74) *Attorney, Agent, or Firm* — Allen E. White

(57) ABSTRACT

The present invention provides molecules useful for aluminum implant in semiconductor materials. The molecules can be used in various doping techniques such as ion implant, plasma doping or derivates methods.

9 Claims, No Drawings

ALUMINUM IMPLANT USING NEW COMPOUNDS

TECHNICAL FIELD

Disclosed herein are non-limiting embodiments of compositions and methods used in the manufacture of semiconductor, photovoltaic, LCD-TFT, or flat panel type devices.

BACKGROUND ART

In transistor fabrication, in the past, aluminum has been widely used as silicon dopant to create P well structures in Si. Aluminum works well for this application because it rapidly diffuses into silicon. Aluminum may also be used to dope copper in order to reduce electro-migration in dual damascene copper lines for instance.

Lavoie et al. (US20080241575) describes the use of various aluminum precursors to dope copper. Aluminum is deposited on top of a metallic structure and the Aluminum diffuses into the film during an annealing step. Methylpyrrolodinealane (MPA), Aluminum s-butoxide, trimethylaluminum (TMA), Triethyl aluminum, di-1-butylaluminum chloride, di-1-butylaluminum hydride, diethylaluminum chloride, tri-1-butylaluminum and trimethyl(tri-sec-butoxy) aluminum are among the claimed aluminum precursors. Other claimed compounds include $H_3Al$, $H_3Al:L$ or $H(R)_2Al:H$ wherein R is an alkyl or a perfluoroalkyl and L is a Lewis base.

Medulla et al. (U.S. Pat. No. 5,497,005) present the use of Alumina ($Al_2O_3$) as source material for Al doping by creating a stream of ionic Aluminum. $Al_2O_3$ is a solid that is challenging to deliver into a chamber in a gas phase. Moreover, Oxygen containing molecules should avoided if possible because of oxidation of the walls of deposition chambers and the difficulty in desorption of such molecules.

Kensuke et al. (JVSTA 16(2), March/April 1998) described the use of $AlCl_3$ for high energy ion implantation using a variable energy radio frequency quadrupole implanter. $Al^{2+}$ implantation is carried out at energy of 0.9 MeV and 1.0 MeV with doses of $1\times10^{14}$ cm$^{-2}$ and $1\times10^{16}$ cm$^{-2}$. However, they state that temperature needs to be carefully controlled in order to have stable ion beams and therefore uniform implantation of the wafers (the vapor pressure of $AlCl_3$ being only 1 Torr at 100 C).

Shibagaki (US20090190908) suggest the use of TMA (Trimethylaluminum) for aluminum implantation. However, TMA is a highly pyrophoric gas meaning that specific safety devices and procedures are needed to handle the gas.

DISCLOSURE OF THE INVENTION

The present invention is related to a method of manufacturing semiconductor devices in which Aluminum doping is performed using specified Aluminum source molecules.

In some embodiments, implanting Aluminum with a co-implant of Boron or other atoms can enhance devices properties as discussed in the background. The boron co-implant can be accomplished using standard boron compounds such as $B_{18}H_{22}$, $BF_3$, diborane, decaborane or a boron cluster. In other aspects, the method may include implanting the target material with other species such as Germanium, Phosphorous, Silicon, Arsenic, Xenon, Nitrogen, Aluminum, Magnesium, Silver, Gold, Fluorine, and combinations thereof.

In some embodiments, another gas may be introduced during Aluminum implantation. The gas may be $N_2$, Ar, He, $H_2$, $NH_3$, or a combination thereof. The additional gas may improve the implantation process by enhancing the dissociation of the molecules producing more Al ions or allowing the formation of Al-containing ion clusters.

The Invention may be further defined in part by the following numbered sentences:

1. A method of implanting aluminum into a substrate or a semiconductor assembly the method comprising, consisting essentially of, or consisting of a step of ion implantation into a substrate or a semiconductor assembly with a starting Aluminum source compound selected from DEACl, DMAH, TMAA, TEAA, DMEAA, MPA, TMAAB or a combination thereof.
2. The method of sentence 1, wherein the aluminum implantation step is performed by an ion beam (beamline), plasma doping or pulsed plasma doping ($P^2LAD$), or Plasma Immersion Ion Implantation (PI3) process.
3. The method of sentences 1 or 2, the method further comprising, consisting essentially of, or consisting of a first step of heating the starting aluminum source compound to increase a vapor phase concentration of the starting aluminum source compound.
4. The method of sentences 1, 2, or 3, wherein at least one element is co-implanted with the Aluminum, the other element(s) comprising one or more of Carbon, Germanium, Phosphorous, Silicon, Arsenic, Xenon, Nitrogen, Aluminum, Magnesium, Silver, Gold, Boron or Fluorine.
5. The method of sentence 4, wherein the other element(s) comprise boron and the boron is supplied in the form of a boron cluster, $B_{18}H_{22}$, $BF_3$, diborane or decaborane.
6. The method of sentences 1, 2, 3, 4 or 5, wherein the implantation is followed by an annealing step.
7. The method of sentences 1, 2, 3, 4, 5 or 6, the method further comprising an Aluminum source compound ionization sub-step to generate Aluminum containing ions that are then implanted.
8. The method of sentences 1, 2, 3, 4, 5, 6 or 7, further comprising a sub-step of introducing another gas in combination with a vapor phase of the Aluminum source compound during the implantation process.
9. The method of sentence 8, wherein the other introduced gas is one or more of $N_2$, Ar, He, $H_2$, $NH_3$.

Aluminum implantation may be performed by any know procedure in the art including:

Ion beam (beamline) implantation may be used as described in I.P. Jain and Garima Agarwal, Ion beam induced surface and interface engineering, Surface Science Reports, Volume 66, Issues 3-4, March 2011, Pages 77-172, ISSN 0167-5729, DOI: 10.1016/j.surfrep.2010.11.001.

Plasma doping or pulsed plasma doping ($P^2LAD$) may be used as described in Felch, S. B, Fang, Z., Koo, B.-W., Liebert, R. B., Walther, S. R., Hacker, D. Plasma doping for the fabrication of ultra-shallow junctions (2002) Surface and Coatings Technology, 156 (1-3), pp. 229-236.

The substrate and film structure may optionally be annealed following the implantation step such as a standard thermal annealing and/or a UV photoannealing step.

Ionic species derived from an Aluminum source molecule are generally the more active implantation species. The Aluminum source molecules of Table 1 are preferred in part because of their ionization patterns.

TABLE 1

| | | | Selected compounds for Aluminum doping | | | | |
|---|---|---|---|---|---|---|---|
| ACRONYM | DEACl | DMAH | TMAA | TEAA | DMEAA | MPA | TMAAB |
| FORMULA | $AlCl(CH_2CH_3)_2$ | $AlH(CH_3)_2$ | $AlH_3$:$Me_3N$ | $AlH_3$:$N(C_2H_5)_3$ | $AlH_3$:$Me_2EtN$ | $AlH_3$:$NMe(CH2)_4$ | $AlH_2(BH_4)$:$N(CH_3)_3$ |
| STATE OF MATTER (25C) | Liquid | liquid | solid | liquid | liquid | Liquid | liquid |
| VAPOR PRESSURE | 1 Torr at 50° C. | 1 Torr at 20° C. | 2 Torr at 25° C. | 0.5 Torr at 25° C. | 1.5 Torr at 25° C. | 2 Torr at 50° C. | 1 Torr at 40° C. |

Exemplary reactions are disclosed in the following exemplary ionization reaction data:
DMAH $$3Al(CH3)2H \rightarrow Al + 1.5H2 + 2Al(CH3)3$$

or $$3Al(CH3)2H \rightarrow 2Al + 3CH4 + Al(CH3)3$$

Other generated compounds are volatile ($H_2$, $CH_4$, TMA). In both reaction pathways, yield pure Al that can be ionized and selectively implanted.
DEACl
Ionization yields the following implantable Al ionic species:
$AlH+$; $Al^+$; $AlCl^+$; $AlCl(CH_2CH_3)^+$
TMAA
The reaction pathway in the described conditions or under a plasma will be as follows:

$$AlH_3:(NMe_3)_2 \rightarrow AlH3(NMe_3) + NMe_3$$

$$AlH_3(NMe_3) \rightarrow AlH_3 + NMe_3$$

$$AlH_3 + 2Al(s) \rightarrow 3AlH(s)$$

$$AlH(s) \rightarrow Al + \tfrac{1}{2}H_2$$

TMAA can thus be used in a plasma for example to produce aluminum ions ($Al^+$, $Al^{2+}$, $Al^{3+}$ for instance) that can be then implanted into a semiconductor substrate.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

What is claimed is:

1. A method of implanting aluminum into a substrate or a semiconductor assembly comprising a step of ion implantation into a substrate or a semiconductor assembly with a starting Aluminum source compound selected from TMAA, TEAA, DMEAA, MPA, TMAAB or a combination thereof.

2. The method of claim 1, wherein the aluminum implantation step is performed by an ion beam (beamline), plasma doping or pulsed plasma doping ($P^2LAD$), or Plasma Immersion Ion Implantation (PI3) process.

3. The method of claim 1, further comprising a first step of heating the starting aluminum source compound to increase a vapor phase concentration of the starting aluminum source compound.

4. The method of claim 1, wherein at least one element is co-implanted with the Aluminum, the other element(s) comprising one or more of Carbon, Germanium, Phosphorous, Silicon, Arsenic, Xenon, Nitrogen, Aluminum, Magnesium, Silver, Gold, Boron or Fluorine.

5. The method of claim 4, wherein the other element(s) comprise boron and the boron is supplied in the form of a boron cluster, $B_{18}H_{22}$, $BF_3$, diborane or decaborane.

6. The method of claim 1, wherein the implantation is followed by an annealing step.

7. The method of claim 1, further comprising an Aluminum source compound ionization step to generate Aluminum containing ions that are then implanted.

8. The method of claim 1, further comprising a step of introducing another gas in combination with a vapor phase of the Aluminum source compound during the implantation process.

9. The method of claim 8, wherein the other introduced gas is one or more of $N_2$, Ar, He, $H_2$, $NH_3$.

* * * * *